Nov. 10, 1970 G. HILLMAN ET AL 3,539,259

METHOD OF MAKING LEAD ARRAY FOR CONNECTION TO MINIATURE ELECTRICAL DEVICE SUCH AS A CHIP

Filed July 7, 1967

INVENTORS
Gary Hillman
Harvey M. Pensack

Jack Schuman
ATTORNEY 3,539,259

METHOD OF MAKING LEAD ARRAY FOR CONNECTION TO MINIATURE ELECTRICAL DEVICE SUCH AS A CHIP

Gary Hillman and Harvey M. Pensack, Livingston, N.J., assignors to Mitronics Inc., Murray Hill, N.J.
Filed July 7, 1967, Ser. No. 651,925
Int. Cl. G03b 27/02
U.S. Cl. 355—132 17 Claims

ABSTRACT OF THE DISCLOSURE

Spaced blind recesses are etched in metallic sheet. Powdered glass is placed in each recess and fused to bond with sheet. Sheet is then covered on both sides with photosensitive acid resistant material, and outline of lead array is photographically impressed on both sides of sheet. After development of acid resistant material, sheet is etched through to leave lead array bonded to pad of glass. Lead array is then cold welded, ultrasonically bonded, or thermo-compression bonded to pillars on chip.

BACKGROUND OF THE INVENTION

This invention relates to a lead array for connection to electrical devices such as miniature integrated circuits known as "chips," and a method of making the same.

Miniature integrated circuits, or "chips," often require connection to a multitude of leads. A typical chip may, for example, be 0.045 inch square and may require connection to a dozen or so leads at various points on the chip. The problems in hooking up these leads to the chip are manifold, as should be apparent.

As reported in Electronics Review, Feb. 20, 1967, pp. 49–50, "flip-chip" techniques have been developed to eliminate some of the difficulties heretofore encountered in hooking up leads to chips. These flip-chip techniques involve the formation of aluminum pillars or bumps at various pertinent portions of the miniature integrated circuit or chip, and lead arrays of predetermined configuration and orientation are then secured to the pillars or bumps by cold welding, thereby to complete the electrical hookup. When there are four or more pillars to be bonded to the lead array, the need for the tops of the pillars, and for the connecting surfaces of the lead array, to be flat becomes quite important. If the pillars are all of the same height, so that the tops thereof are co-planar, and if the connecting surfaces of the lead array are not co-planar, serious problems in completing the electrical hookup may occur. For example, less than all of the electrical connections may be made, or the chip may break under the pressure of cold welding.

SUMMARY OF THE INVENTION

One of the objects of this invention is to provide an improved lead array for connection to electrical devices such as chips, and an improved method of making same.

Another of the objects of this invention is to provide an improved lead array for the purpose above mentioned, with co-planar connecting surfaces on the leads, and an improved method of making same.

A further object of this invention is to provide an improved lead array for the purpose above mentioned, having accurately formed profiles at relatively close spacing, and an improved method of making same.

Yet other and further objects of this invention will become apparent during the course of the following description.

It has been discovered that the foregoing objects can be obtained by etching spaced blind recesses in a flat metallic sheet; filling the recesses with glass or other electrically insulating material and fusing or otherwise bonding the material to the sheet; coating both sides of the sheet with a photosensitive acid resistant material; photographically impressing the outline of the lead arrays on the acid resistant material and then developing the same; and etching through the sheet to leave the lead arrays bonded to the pads of electrically insulating material. The flat, accurately formed lead arrays can then be pressure welded to chips.

BRIEF DESCRIPTION OF THE DRAWING

Referring now to the drawing, in which like numerals represent like parts in the several views.

DESCRIPTION OF THE PREFERRED EMBODIMENT

Flat sheet 1 of electrically conductive material, such as a nickel-iron-cobalt alloy known as Kovar, is provided with a plurality of spaced recesses 2 extending partially therethrough (i.e., the recesses 2 are "blind").

A preferred method of forming recesses 2 in sheet 1 is to etch with acid through a pattern of open areas formed in an acid-or-etch-resistant material applied to the sheet 1.

While any suitable acid resistant material, which may be applied as a film or coating and is compatible with and adherable to said sheet 1, may be utilized, it is preferred to use a photosensitive resist, such as that sold under the trade name of Kodak KPR Photoresist by Eastman Kodak Company of Rochester, N.Y. This preferred resist, catalog No. KPR, and the method for using it are described in publication P–7, entitled "Kodak Photosensitive Resists for Industry," copyrighted in 1962 by the Eastman Kodak Company of Rochester, N.Y.

Thus, after sheet 1 has been thoroughly cleaned by conventional methods, a continuous layer of photosensitive resist material comprising the heretofore noted preferred Kodak photosensitive resist is sprayed over the sheet 1 and is thereafter dried at a temperature of not over 250° F. A photographic negative having a pattern of opaque squares corresponding to the desired pattern of recesses 2 is placed over the resist layer and the assembly exposed to a carbon arc light for approximately 2 minutes. Immediately after exposure, the negative is removed and the photosensitive resist material is developed by immersion in a photo resist developer for 2 to 3 minutes. The photographically unexposed photosensitive resist material is thereafter washed out by means of a xylene spray. After this washout, only that portion of sheet 1 between recesses 2 is covered with photographically exposed resist material, while those portions of sheet 1 in which recesses 2 are to be formed are uncovered. Recesses 2 are then acid-etched by conventional means in sheet 1, using conventional etches such as Kovar etch. After completion of the etching of recesses 2, the photographically exposed resist material on sheet 1 is removed by any suitable means such as, for example, by using a commercial stripper or by washing in a bath of trichloroethylene or the like.

Figures 1, 2, 3, 4:
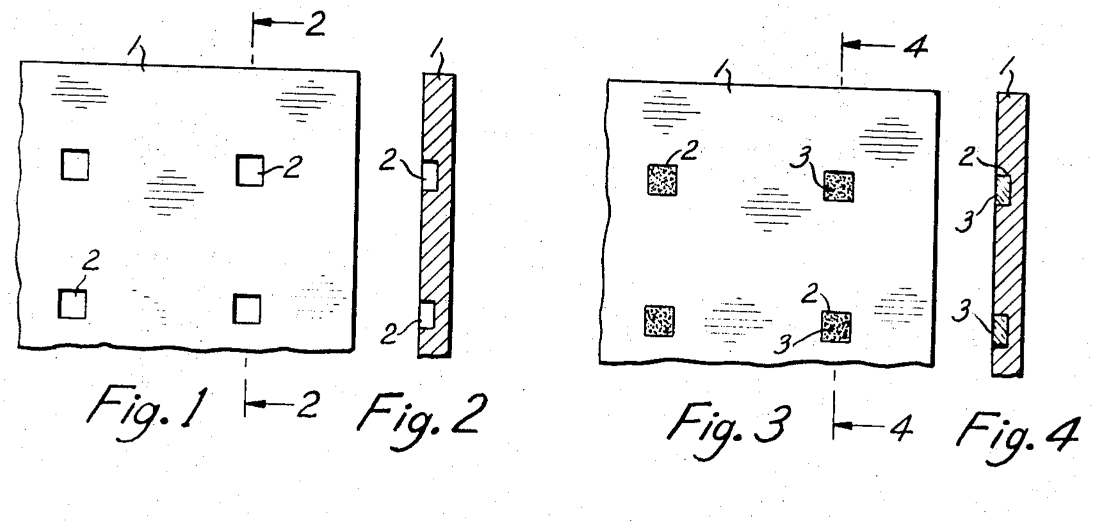
FIG. 1 represents a view in plan of a portion of a flat metallic sheet in an early stage of the method of this invention, with a number of spaced recesses etched into the surface thereof.
FIG. 2 represents a view in section taken along the line 2—2 of FIG. 1, showing two of the spaced recesses etched into the surface of the flat metallic sheet.
FIG. 3 represents a view in plan of a portion of the flat metallic sheet of FIG. 1 in a later stage of the method of this invention, showing the spaced recesses filled with an electrically insulating substrate material such as glass.
FIG. 4 represents a view in section taken along the line 4—4 of FIG. 3, showing two of the spaced recesses filled with an electrically insulating substrate material such as glass.

At this point, sheet 1 will have a pattern of spaced recesses 2 formed partially therethrough as shown in FIGS. 1 and 2. Sheet 1 may, for example, be 0.01 inch thick, and recesses 2 are preferably etched to half this depth, viz. to a depth of 0.005 inch. Typically, recesses 2 may be squares 0.1 inch on a side, although other configurations of recesses 2 are contemplated. The spacing between recesses 2 should be slightly in excess of the width and breadth dimensions of the array of leads to be formed about each recess 2 as hereinafter described.

Electrically insulating substrate material 3, such as #7052 glass (Corning Code) is deposited in each recess 2, so as to entirely fill the said recesses 2. This may be done by means of preforms, to facilitate the employment of automation to this step of the process. The material 3 is then bonded to sheet 1 by fusion or melting in situ. In place of Corning #7052 glass, plastics or ceramics may be deposited in recesses 2 and appropriately bonded to sheet 1.

At this point, sheet 1 will have a pattern of squares of electrically insulating material 3 formed therein and bonded thereto, as shown in FIGS. 3 and 4.

If necessary, sheet 1 may now be cleaned, by conventional methods, before proceeding to the next step.

Sheet 1 is now coated with an acid resistant material in the pattern of the lead array. Preferably, such coating is applied to both sides of sheet 1.

While any suitable acid resistant material, which may be applied as a film or coating and is compatible with and adherable to said sheet 1, may be utilized, it is preferred to use the previously mentioned photosensitive resist, Kodak KPR Photoresist.

Figures 5, 6, 7, 8, 9:
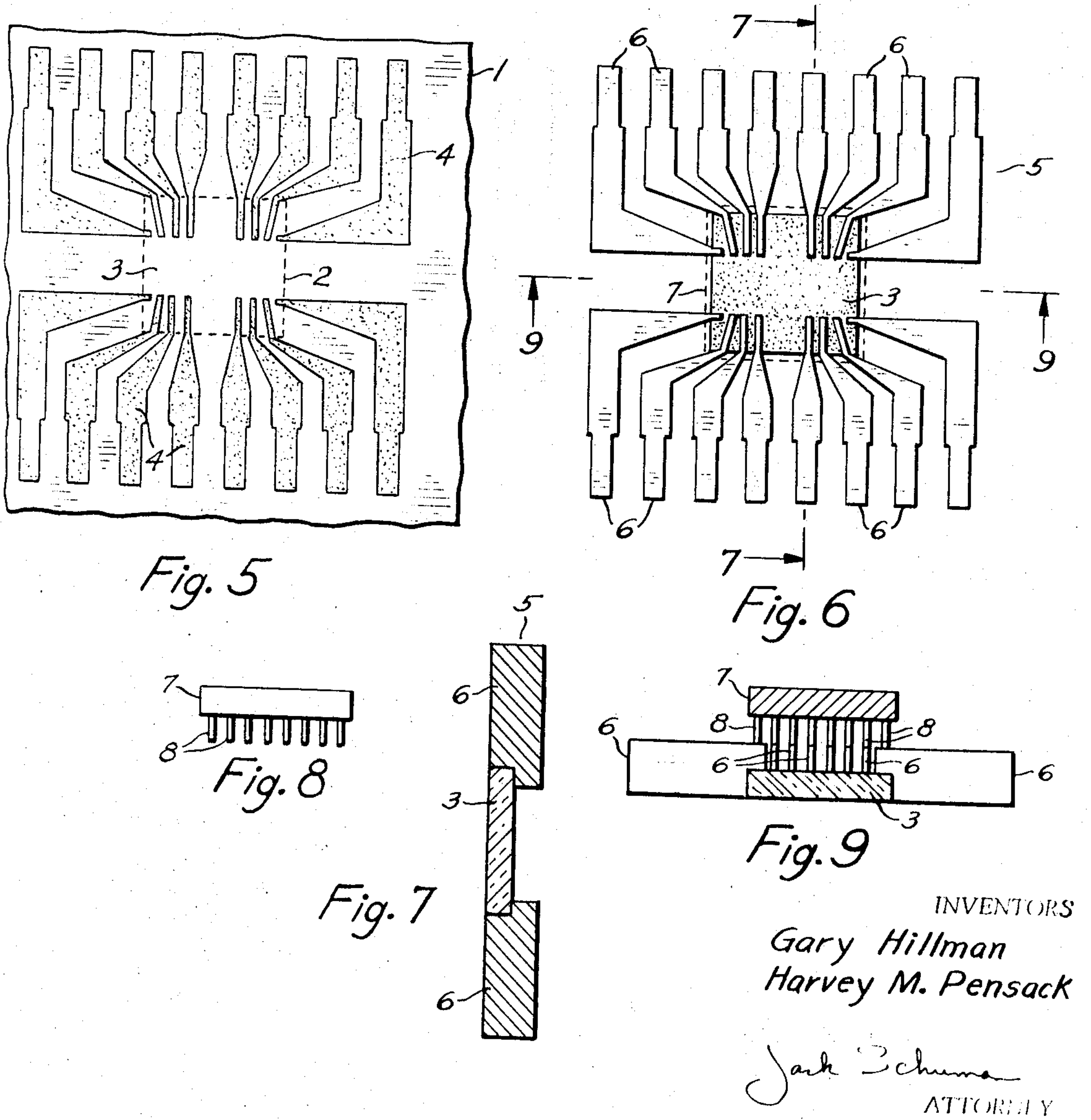
FIG. 5 represents an enlarged view in plan of a portion of the flat metallic sheet, taken from the rear of FIG. 3 (i.e., from the right of FIG. 4), showing the glass-filled recess in dotted lines, and the outline of the future lead array impressed upon the surface of the metallic sheet as by photographic means on a photosensitive acid resistant material.
FIG. 6 represents a view in plan of the lead array etched from the metallic sheet and the square of electrically insulating substrate material bonded thereto, the dotted lines indicating diagrammatically the outline of the miniature integrated circuit or "chip" of semiconductor material to be subsequently secured thereto.
FIG. 7 represents a view in section taken along the line 7—7 of FIG. 6, showing leads etched from the metallic sheet and the square of electrically insulating substrate material bonded thereto.
FIG. 8 represents, diagrammatically only, a view in elevation of a miniature integrated circuit or "chip" of semiconductor material, showing pillars of conductive material formed thereon and exaggerated dimensionally for purposes of clarity.
FIG. 9 represents a view in section taken along the line 9—9 of FIG. 6, showing the assembly of the leads and the miniature integrated circuit or "chip" of semiconductor material, the pillars of conductive material formed on the chip being exaggerated dimensionally for purposes of clarity.

Thus, a continuous layer of photosensitive resist material comprising the heretofore noted preferred Kodak photosensitive resist is sprayed over both sides of sheet 1 and is thereafter dried as hereinbefore mentioned. Photographic negatives, each having a pattern of opaque areas corresponding with areas between the leads of the desired lead arrays, are placed on both sides of sheet 1, the patterns of the opposing negatives registering with each other, and the assembly exposed to a carbon arc light as hereinbefore described. Immediately after exposure, the negatives are removed, and the photosensitive resist material developed as hereinbefore described. The photographically unexposed photosensitive resist material (corresponding to those areas between the leads of the desired lead arrays) is then washed out by means of a xylene spray. After this washout, only those portions of sheet 1 which correspond with the leads of the desired lead arrays remain covered with photographically exposed resist material 4 as shown in FIG. 5. The sheet 1 is now acid-etched therethrough by a suitable reagent or etchant such as Kovar etch which attacks the metal only and not the electrically insulating material 3. At the conclusion of this acid etching step, a plurality of bases 5, each comprising a square or pad of electrically insulating material 3 bonded to an array of leads 6, remains, as shown in FIGS. 6 and 7. After completion of this step, the photographically exposed resist material on leads 6 is removed as hereinbefore described, and the bases 5 are cleaned before proceeding to the next step.

The electrical component or device 7 to which leads 6 of base 5 is to be connected is shown diagrammatically in FIG. 8. Component 7 may be a miniature integrated circuit or "chip" of semiconductor material and, as is now the practice, component 7 has been shown as "pillared;" that is to say, pillars or bumps 8 of electrically conductive material, such as aluminum, having been formed or deposited, by suitable means such as growing, vacuum deposition or the like, on appropriate areas of the component 7. The tops of pillars 8 lie in the same plane.

Base 5 is now to be assembled to component 7. It will be understood that the pattern of the array of leads 6 has been chosen to correspond with the pattern of pillars 8. Component 7 is oriented relative to base 5 so that leads 6 register with their respective pillars 8, and component 7 and base 5 are brought together under pressure to cold weld pillars 8 to their respective leads 6. Instead of cold welding, ultrasonic bonding or thermo-compression bonding may be employed to secure pillars 8 to their respective leads 6. The completed assembly is shown in FIG. 9.

It will be recognized that, as the tops of pillars 8 are co-planar, it is important to a successful joining of component 7 to base 5 that the surfaces of leads 6 that will engage, and be secured to, pillars 8 likewise be co-planar, particularly when there are four or more such pillars. It will be apparent that the method herein described insures such co-planarity of leads 6, as they are formed from a flat sheet 1.

The preferred profile of leads 6 is, as shown in FIG. 6, with a thin portion adjacent and over the square of electrically insulating material 3, and with a thicker portion away from the square of electrically insulating material. The thin portions permit the close placing of many leads 6 on a small square or pad of electrically insulating material 3, thereby to accommodate close spaced pillars 8 on component 7, and the thicker portions provide strength.

We claim:

1. Method of making a lead array for plural electrical connection to a miniature electrical device, said method comprising the following steps:
   - (a) forming a blind recess partially through a metallic sheet,
   - (b) bonding a block of electrically insulating etch-resistant material to said metallic sheet in said recess,
   - (c) applying to said metallic sheet an etch-resistant coating, the outline of said etch-resistant coating corresponding with the outline of the desired lead array, a portion of said etch-resistant coating being adjacent to said block of electrically insulating etch-resistant material,
   - (d) applying to said metallic sheet an etching agent, thereby etching through said metallic sheet beyond the outline of said etch-resistant coating and leaving said lead array bonded to said block of electrically insulating etch-resistant material.

2. Method as in claim 1, further comprising:
(e) removing the etch-resistant coating after the completion of step (d).

3. Method as in claim 1, step (c) being performed on both sides of said metallic sheet.

4. Method as in claim 1, step (c) comprising the following sub-steps:
(e) coating said metallic sheet with a photosensitive etch-resistant material,
(f) photographically impressing the outline of the desired lead array on said photosensitive etch-resistant material,
(g) developing said photosensitive etch-resistant material thereby to leave said photosensitive etch-resistant material within the outline of the desired lead array and to remove said photosensitive etch resistant material beyond the outline of the desired lead array.

5. Method as in claim 1, step (c) comprising the following sub-steps:
(e) coating both sides of said metallic sheet with a photosensitive etch-resistant material,
(f) photographically impressing on the photosensitive etch-resistant material on both sides of said metallic sheet in registry the outline of the desired lead array,
(g) developing said photosensitive etch-resistant material thereby to leave said photosensitive etch-resistant material within the outline of the desired lead array on both sides of the metallic sheet and to remove said photosensitive etch-resistant material beyond the outline of the desired lead array on both sides of said metallic sheet.

6. Method as in claim 5, step (a) comprising the following sub-steps:
(h) coating the side of said metallic sheet in which the blind recess is to be formed with a photosensitive etch-resistant material,
(i) photographically impressing the outline of said recess on said photosensitive etch-resistant material,
(j) developing said photosensitive etch-resistant material whereby to leave said photosensitive etch-resistant material beyond the outline of said recess and to remove said photosensitive etch-resistant material from within the outline of said recess,
(k) etching only partially through said metallic sheet to form said blind recess,
(l) removing photosensitive etch-resistant material remaining on said metallic sheet after the completion of step (j).

7. Method as in claim 1, said metallic sheet having a flat surface on the front thereof, said blind recess being formed from the rear of said metallic sheet.

8. Method as in claim 1, step (a) comprising the following sub-steps:
(e) coating the side of said metallic sheet in which the blind recess is to be formed with etch-resistant material beyond the outline of said recess,
(f) etching only partially through said metallic sheet to form said blind recess,
(g) removing said etch-resistant material.

9. Method as in claim 1, step (a) comprising the following sub-steps:
(e) coating the side of said metallic sheet in which the blind recess is to be formed with a photosensitive etch-resistant material,
(f) photographically impressing the outline of said recess on said photosensitive etch-resistant material,
(g) developing said photosensitive etch-resistant material thereby to leave said photosensitive etch-resistant material beyond the outline of said recess and to remove said photosensitive etch-resistant material from within the outline of said recess,
(h) etching only partially through said metallic sheet to form said blind recess,
(i) removing photosensitive etch-resistant material remaining on said metallic sheet after the completion of step (g).

10. Method of making a lead array for plural electrical connection to a miniature electrical device, said method comprising the following steps:
(a) bonding to one side of a metallic sheet a block of electrically insulating etch-resistant material,
(b) applying to one side of said metallic sheet an etch-resistant coating, the outline of said etch-resistant coating corresponding with the outline of the desired lead array, a portion of said etch-resistant coating being adjacent to said block of electrically insulating etch-resistant material,
(c) applying to said metallic sheet an etching agent, thereby etching through said metallic sheet beyond the outline of said etch-resistant coating and leaving said lead array bonded to said block of electrically insulating etch-resistant material.

11. Method as in claim 10, further comprising:
(d) removing the etch-resistant coating after the completion of step (c).

12. Method as in claim 10, step (b) being performed on both sides of said metallic sheet.

13. Method as in claim 10, step (b) comprising the following sub-steps:
(d) coating said metallic sheet with a photosensitive etch-resistant material,
(e) photographically impressing the outline of the desired lead array on said photosensitive etch-resistant material,
(f) developing said photosensitive etch-resistant material thereby to leave said photosensitive etch-resistant material within the outline of the desired lead array and to remove said photosensitive etch-resistant material beyond the outline of the desired lead array.

14. Method of making a lead array for plural electrical connection to a miniature electrical device, said method comprising the following steps:
(a) forming a blind recess partially through a metallic sheet,
(b) inserting a quantity of electrically insulating etch-resistant material in said blind recess,
(c) bonding said quantity of electrically insulating etch-resistant material to said metallic sheet,
(d) coating said metallic sheet with a photosensitive etch-resistant material,
(e) photographically impressing the outline of the desired lead array on said photosensitive etch-resistant material, a portion of the desired lead array within said outline being adjacent to said quantity of electrically insulating etch-resistant material,
(f) developing said photosensitive etch-resistant material thereby to leave said photosensitive etch-resistant material within the outline of the desired lead array and to remove said photosensitive etch-resistant material beyond the outline of the desired lead array,
(g) etching through said metallic sheet, thereby leaving said lead array bonded to said quantity of electrically insulating etch-resistant material.

15. Method as in claim 14, steps (d), (e) and (f) being performed on both sides of said metallic sheet.

16. Method as in claim 15, step (a) comprising the following sub-steps:
(h) coating the side of said metallic sheet in which the blind recess is to be formed with a photosensitive etch-resistant material,
(i) photographically impressing the outline of said recess on said photosensitive etch-resistant material,
(j) developing said photosensitive etch-resistant material thereby to leave said photosensitive etch-resistant material beyond the outline of said recess and to remove said photosensitive etch-resistant material from within the outline of said recess,
(k) etching only partially through said metallic sheet to form said blind recess,
(l) removing photosensitive etch-resistant material remaining on said metallic sheet after the completion of step (j).

17. Method of making a lead array for plural electrical connection to a miniature electrical device, said method comprising the following steps:
(a) forming a blind recess partially through a metallic sheet, according to the following sub-steps:
  (i) coating the side of said metallic sheet in which the blind recess is to be formed with a photosensitive etch-resistant material,
  (ii) photographically impressing the outline of said recess on said photosensitive etch-resistant material,
  (iii) developing said photosensitive etch-resistant material thereby to leave said photosensitive etch-resistant material beyond the outline of said recess and to remove said photosensitive etch-resistant material from within the outline of said recess,
  (iv) etching only partially through said metallic sheet to form said blind recess,
  (v) removing photosensitive etch-resistant material remaining on said metallic sheet after the completion of step (iii),
(b) inserting a quantity of electrically insulating etch-resistant material in said blind recess,
(c) bonding said quantity of electrically insulating etch-resistant material to said metallic sheet,
(d) coating said metallic sheet with etch-resistant material within the outline of the desired lead array,
(e) etching through said metallic sheet, thereby leaving said lead array bonded to said quantity of electrically insulating etch-resistant material.

References Cited

UNITED STATES PATENTS 3,306,176 2/1967 Myers ---------------- 355—132

JOHN M. HORAN, Primary Examiner

U.S. Cl. X.R.

174—52